US006794115B2

(12) United States Patent
Telser et al.

(10) Patent No.: US 6,794,115 B2
(45) Date of Patent: Sep. 21, 2004

(54) METHOD FOR THE PRODUCTION OF THERMALLY CROSS-LINKED LASER ENGRAVABLE FLEXOGRAPHIC ELEMENTS

(75) Inventors: Thomas Telser, Heidelberg (DE); Jens Schadebrodt, Mainz (DE); Margit Hiller, Karlstadt (DE); Wolfgang Wenzl, Mannheim (DE)

(73) Assignee: BASF Drucksysteme GmbH, Stuttgart (DE)

( * ) Notice: Subject to any disclaimer, the term of this patent is extended or adjusted under 35 U.S.C. 154(b) by 0 days.

(21) Appl. No.: 10/250,867

(22) PCT Filed: Jan. 7, 2002

(86) PCT No.: PCT/EP02/00066

§ 371 (c)(1), (2), (4) Date: Jul. 29, 2003

(87) PCT Pub. No.: WO02/054154

PCT Pub. Date: Jul. 11, 2002

(65) Prior Publication Data

US 2004/0048198 A1 Mar. 11, 2004

(30) Foreign Application Priority Data

Jan. 8, 2001 (DE) ........................................ 101 00 514

(51) Int. Cl.[7] .................................................. G03F 7/11

(52) U.S. Cl. ............................... 430/273.1; 430/271.1; 430/281.1; 430/286.1; 430/306; 430/309; 430/348; 430/494; 430/945

(58) Field of Search ........................... 430/270.1, 271.1, 430/273.1, 281.1, 286.1, 287.1, 288.1, 306, 309, 348, 401, 494, 944, 945

(56) References Cited

U.S. PATENT DOCUMENTS 4,323,636 A 4/1982 Chen .......................... 430/271
5,259,311 A 11/1993 McCaughey, Jr. ........ 101/401.1
5,474,875 A 12/1995 Loerzer et al. ............. 430/281
6,037,102 A * 3/2000 Loerzer et al. ............. 430/306
6,326,128 B1 * 12/2001 Telser et al. ................ 430/306

FOREIGN PATENT DOCUMENTS

| | | |
|---|---|---|
| DE | 2 215 090 | 10/1972 |
| EP | 0 084 851 | 8/1983 |
| EP | 0 553 662 | 1/1993 |
| EP | 0 819 984 | 1/1998 |
| WO | WO 93/23252 | 11/1993 |

* cited by examiner

*Primary Examiner*—Barbara Gilliam
(74) *Attorney, Agent, or Firm*—Nixon & Vanderhye P.C.

(57) ABSTRACT

Laser-engravable flexographic printing elements including a thermally crosslinked, elastomeric, laser-engravable relief-forming layer E are made by producing a multilayer composite which has at least a two-layer composite formed of a depot layer D and an uncrosslinked precursor layer V for the relief-forming layer E which is directly adjacent to the depot layer D. Optionally, the multilayer composite may include further layers, such as support foils or films and/or protective films. The precursor layer V most preferably includes at least one elastomeric binder, and at least one ethylenically unsaturated monomer and, optionally an absorber for laser radiation and/or further additives. The depot layer D most preferably includes at least one elastomeric binder, and at least one thermally decomposing polymerization initiator and, optionally, an absorber for laser radiation and/or further additives. The thermally decomposing polymerization initiators are allowed to diffuse out of the depot layer D into the precursor layer V. If desired the depot layer D may be removed. Thermal crosslinking of the precursor layer V thereby yields the crosslinked elastomeric, laser-engravable, relief-forming layer E.

10 Claims, No Drawings

METHOD FOR THE PRODUCTION OF THERMALLY CROSS-LINKED LASER ENGRAVABLE FLEXOGRAPHIC ELEMENTS

This application is the US national phase of international application PCT/EP02/00066 filed Jan. 7, 2002 which designated the U.S.

The present invention relates to a process for the production of thermally crosslinked, laser-engravable flexographic printing elements, to the production of relief printing plates from the laser-engravable flexographic printing elements, and the thermally uncrosslinked flexographic printing elements.

The conventional method for the production of flexographic printing plates by laying a photographic mask on a photopolymeric recording element, irradiating the element with actinic light through this mask, and washing the unpolymerized areas of the exposed element out using a developer liquid is increasingly being replaced by methods in which lasers are used.

In laser direct engraving, pits are engraved directly into a suitable elastomeric layer with the aid of a laser of sufficiently high power, in particular by means of an IR laser, forming a relief which is suitable for printing. To this end, large amounts of the material of which the printing relief consists have to be removed. A typical flexographic printing plate is nowadays, for example, between 0.5 and 7 mm in thickness and the non-printing pits in the plate are between 0.3 and 3 mm in depth. The method of laser direct engraving for the production of flexographic printing plates has therefore only attracted commercial interest in recent years with the appearance of improved laser systems, although laser engraving of rubber printing cylinders using CO2 lasers has basically been known since the late 1960s. The demand for suitable laser-engravable flexographic printing elements as starting material for the production of flexographic printing plates by means of laser engraving has thus also increased significantly.

In principle, commercially available photopolymerizable flexographic printing elements can be employed for the production of flexographic printing plates by means of laser engraving. U.S. Pat. No. 5,259,311 discloses a process in which, in a first step, the flexographic printing element is photochemically crosslinked by irradiation over the full area and, in a second step, a printing relief is engraved by means of a laser. However, the sensitivity of flexographic printing elements of this type to CO2 lasers is low.

It has therefore been proposed, for example in EP-A 0 640 043 and EP-A 0 640 044, to admix substances which absorb IR radiation with the elastomeric layer to be laser-engraved in order to increase the sensitivity. However, substances of this type, such as carbon black or certain dyes, also absorb very strongly in the UV/VIS region. Flexographic printing elements which comprise these absorbers therefore can at best be photochemically crosslinked in a very thin layer, or not at all. Thus, EP-A 0 640 043 discloses the production of a carbon black-containing, elastomeric layer by photocrosslinking. However, this layer only has a thickness of 0.076 mm, while the typical thickness of commercially available flexographic printing plates is from 0.5 to 7 mm.

It has therefore likewise been proposed, for example in EP-A 0 640 044, to add thermally decomposing polymerization initiators to the elastomeric layer which is to be laser-engraved and to crosslink this layer thermally. Photocrosslinkable, flexible printing plates based on thermoplastic elastomers are produced in an elegant manner by extrusion and calendering at elevated temperatures using thermally stable photoinitiators. However, this production method is difficult on use of thermally decomposing initiators since, owing to the high working temperatures and owing to the high shear during production of the thermally crosslinkable mixture in the extruder, premature crosslinking may occur. Owing to the temperature sensitivity of the crosslinkable mixture, low working temperatures of significantly below 100° C. are necessary, and consequently processing in a twin-screw extruder, for example, is not possible.

It is an object of the present invention to provide a process for the production of laser-engravable flexographic printing plates having a thermally crosslinked, elastomeric, relief-forming layer.

We have found that this object is achieved by a process for the production of a laser-engravable flexographic printing element comprising a thermally crosslinked, elastomeric, relief-forming layer E, having the following steps:

(i) production of a multilayer composite at least comprising a two-layer composite consisting of a depot layer D and an uncrosslinked precursor layer V for the relief-forming layer E which is directly adjacent to the depot layer D, and optionally further layers, support foils or films and/or protective films,
  where the precursor layer V comprises
  (a) at least one elastomeric binder,
  (b) at least one ethylenically unsaturated monomer,
  (c) optionally an absorber for laser radiation, and
  (d) optionally further additives,
  and the depot layer D comprises
  (e) at least one elastomeric binder,
  (f) at least one thermally decomposing polymerization initiator,
  (g) optionally an absorber for laser radiation, and
  (h) optionally further additives, (ii) allowing the thermally decomposing polymerization initiators to diffuse out of the depot layer D into the precursor layer V, (iii) if desired removal of the depot layer D, and (iv) thermal crosslinking of the precursor layer V to give the elastomeric, relief-forming layer E.

In a first step (i), a multilayer composite at least comprising a two-layer composite consisting of the depot layer D and the uncrosslinked precursor layer V for the relief-forming layer E which is adjacent to the depot layer D is produced.

The precursor layer V comprises at least one elastomeric binder as component (a).

The elastomeric binders employed can be all known binders also used for the production of photopolymerizable flexographic printing plates. In principle, both elastomeric binders and thermoplastic elastomeric binders are suitable. Examples of suitable binders are the known three-block copolymers of the SIS or SBS type, which may also be fully or partially hydrogenated. It is also possible to employ elastomeric polymers of the ethylene-propylene-diene type, ethylene-acrylic acid rubbers or elastomeric polymers based on acrylates or acrylate copolymers. Further examples of suitable polymers are disclosed in DE-A 22 15 090, EP-A 084 851, EP-A 819 984 or EP-A 553 662. It is also possible to employ mixtures of two or more different binders.

The type and amount of the binder employed are selected by the person skilled in the art depending on the desired properties of the printing relief. In general, the amount of binder is from 50 to 90% by weight, preferably from 60 to 90% by weight, based on the sum of all constituents of the precursor layer, i.e. the sum of components (a) to (d).

The precursor layer comprises at least one ethylenically unsaturated monomer as component (b).

Ethylenically unsaturated monomers which can be employed are basically those which are usually also employed for the production of photopolymerizable flexographic printing elements. The monomers should be compatible with the binders and have at least one polymerizable, ethylenically unsaturated double bond. Suitable monomers generally have a boiling point of above 100° C. at atmospheric pressure and a molecular weight of up to 3000 g/mol, preferably up to 2000 g/mol. Monomers which have proven particularly advantageous are esters or amides of acrylic acid or methacrylic acid with monofunctional or polyfunctional alcohols, amines, aminoalcohols or hydroxyethers and -esters, styrene or substituted styrenes, esters of fumaric or maleic acid or allyl compounds. Examples of suitable monomers are butyl acrylate, 2-ethylhexyl acrylate, lauryl acrylate, 1,4-butanediol diacrylate, 1,6-hexanediol diacrylate, 1,6-hexanediol dimethacrylate, 1,9-nonanediol diacrylate, trimethylolpropane triacrylate, dioctyl fumarate and N-dodecylmaleimide. It is also possible to employ mixtures of different monomers. In general, the total amount of the monomers is from 5 to 30% by weight, preferably from 5 to 20% by weight, based on the sum of components (a) to (d).

The precursor layer may furthermore comprise an absorber for laser radiation as component (c). The precursor layer preferably comprises an absorber of this type. Suitable absorbers for laser radiation have high absorption in the region of the laser wavelength. Particularly suitable absorbers are those which have high absorption in the near infrared and in the longer-wave VIS region of the electromagnetic spectrum. Absorbers of this type are particularly suitable for the absorption of the radiation from high-power Nd:YAG lasers (1064 nm) and from IR diode lasers, which typically have wavelengths between 700 and 900 nm and between 1200 and 1600 nm.

Examples of suitable absorbers for the laser radiation are dyes which absorb strongly in the infra-red spectral region, for example phthalocyanines, naphthalocyanines, cyanines, quinones, metal complex dyes, for example dithiolenes, or photochromic dyes.

Further suitable absorbers are inorganic pigments, in particular intensely colored inorganic pigments, for example chromium oxides, iron oxides, carbon black or metallic particles.

Particularly suitable absorbers for laser radiation are finely divided carbon black grades having a particle size of from 10 to 50 nm.

Further particularly suitable absorbers for laser radiation are iron-containing solids, in particular intensely colored iron oxides. Iron oxides of this type are commercially available and are usually employed as colored pigments or as pigments for magnetic recording. Suitable absorbers for laser radiation are, for example, FeO, goethite (alpha-FeOOH), akaganeite (beta-FeOOH), lepidocrocite (gamma-FeOOH), hematite (alpha-Fe2O3), maghemite (gamma-Fe2O3), magnetite (Fe3O4) or berthollide. It is furthermore possible to employ doped iron oxides or mixed oxides of iron with other metals. Examples of mixed oxides are umbra Fe2O3 x n MnO2 or FexAl(1−x)OOH, in particular various spinel black pigments, for example Cu(Cr,Fe)2O4, Co(Cr,Fe)2O4 or Cu(Cr,Fe,Mn)2O4. Examples of dopants are P, Si, Al, Mg, Zn and Cr. Dopants of this type are generally added in small amounts during the synthesis of the oxides in order to control the particle size and particle shape. The iron oxides may also be coated. Coatings of this type can be applied, for example, in order to improve the dispersibility of the particles. These coatings may consist, for example, of inorganic compounds, such as SiO2 and/or AlOOH. However, it is also possible to apply organic coatings, for example organic adhesion promoters, such as aminopropyl (trimethoxy)silane. Particularly suitable absorbers for laser radiation are FeOOH, Fe2O3 and Fe3O4, very particularly preferably Fe3O4.

The size of the iron-containing, inorganic solids employed, in particular the iron oxides, is selected by the person skilled in the art depending on the desired properties of the recording material. However, solids having a mean particle size of greater than 10 μm are generally unsuitable. Since iron oxides, in particular, are anisometric, this dimension refers to the longest axis. The particle size is preferably less than 1 μm. It is also possible to employ so-called transparent iron oxides, which have a particle size of less than 0.1 μm and a specific surface area of up to 150 m2/g.

Further iron-containing compounds which are suitable as absorbers for laser radiation are iron metal pigments. Particularly suitable are needle-shaped or rice grain-shaped pigments having a length of from 0.1 to 1 μm. Pigments of this type are known as magnetic pigments for magnetic recording. Besides iron, further dopants, such as Al, Si, Mg, P, Co, Ni, Nd or Y, may also be present, or the iron metal pigments may be coated therewith. Iron metal pigments are partially oxidized on the surface for protection against corrosion and consist of a doped or undoped iron core and a doped or undoped iron oxide shell.

At least 0.1% by weight of absorber, based on the sum of all components (a) to (d), is employed. The amount of absorber added is selected by the person skilled in the art depending on the respective desired properties of the laser-engravable flexographic printing element. In this connection, the person skilled in the art will take into account that the absorbers added influence not only the rate and efficiency of the laser-engraving of the elastomeric layer, but also other properties of the flexographic printing element, for example its hardness, elasticity, thermal conductivity, and ink take-up. In general, therefore, more than 20% by weight of absorber for laser radiation, based on the sum of all constituents of the laser-engravable elastomeric layer, is unsuitable. The amount of absorber for laser radiation is preferably from 0.5 to 15% by weight and particularly preferably from 0.5 to 10% by weight.

The precursor layer V may optionally comprise further additives as component (d) for establishing the desired properties of the relief layer. Further additives are plasticizers, fillers, dyes, compatibilizers and dispersion aids. However, the amount of further constituents of this type should generally not exceed 20% by weight, preferably 10% by weight, based on the sum of components (a) to (d).

The depot layer D likewise comprises an elastomeric binder as component (e). The same elastomeric binders which are also employed in the precursor layer can be used; it is preferred to use the same elastomeric binders in the precursor and depot layers.

The depot layer D comprises at least one thermally decomposing polymerization initiator as component (f).

Suitable polymerization initiators are in principle all thermal initiators which can be employed for free-radical polymerization, for example peroxides, hydroperoxides or azo compounds.

The choice of suitable initiators has particular importance for carrying out the process according to the invention.

Suitable thermal initiators do not decompose into free radicals until the final step of the process according to the invention, the thermal crosslinking, and then do so at high reaction rate. They are substantially thermally stable in the preceding process steps of melting, mixing, extrusion and calendering or casting from solution or dispersion, evaporation of the solvent and lamination. The term "substantially thermally stable" in this connection means that the initiators decompose at most so slowly during performance of these steps of the process according to the invention that crosslinking of the layer and/or of the mixture by polymerization can only take place to a minor extent. The thermal stability of an initiator is usually indicated by means of the temperature of the 10 hour half life 10 h-t½, i.e. the temperature at which 50% of the original amount of initiator has decomposed to form free radicals after 10 hours. Further details in this respect are given in "Encyclopedia of Polymer Science and Engineering", Vol. 11, pages 1 ff., John Wiley & Sons, New York, 1988.

Particularly suitable initiators for carrying out the process according to the invention usually have a 10 h-t½ of at least 60° C., preferably of at least 70° C. Particularly suitable initiators have a 10 h-t½ of from 80° C. to 150° C.

Examples of suitable initiators include certain peroxy esters, such as t-butyl peroctanoate, t-amyl peroctanoate, t-butyl peroxyisobutyrate, t-butyl per-oxymaleate, t-amyl perbenzoate, di-t-butyl diperoxyphthalate, t-butyl perbenzoate, t-butyl peracetate and 2,5-di(benzoylperoxy)-2,5-dimethylhexane, certain diperoxyketals, such as 1,1-di(t-amylperoxy)cyclohexane, 1,1-di(t-butylperoxy)cyclohexane, 2,2-di(t-butylperoxy)butane and ethyl 3,3-di(t-butylperoxy)butyrate, certain dialkyl peroxides, such as di-t-butyl peroxide, t-butyl cumyl peroxide, dicumyl peroxide and 2,5-di(t-butylperoxy)-2,5-dimethylhexane, certain diacyl peroxides, such as dibenzoyl peroxide and diacetyl peroxide, certain t-alkyl hydroperoxides, such as t-butyl hydroperoxide, t-amyl hydroperoxide, pinane hydroperoxide and cumyl hydroperoxide. Also suitable are certain azo compounds, for example 1-(t-butylazo)formamide, 2-(t-butylazo)isobutyronitrile, 1-(t-butylazo)cyclohexanecarbonitrile, 2-(t-butylazo)-2-methylbutanenitrile, 2,2'-azobis(2-acetoxypropane), 1,1'-azobis(cyclohexanecarbonitrile), 2,2'-azobis(isobutyronitrile) and 2,2'-azobis(2-methylbutanenitrile).

The concentration of the thermally decomposing initiators in the depot layer depends on the thickness of the depot layer relative to the thickness of the laser-engravable, relief-forming elastomeric layer.

The concentration of the thermally decomposing polymerization initiators after they have diffused in and before the thermal crosslinking in the precursor layer is usually from about 1 to 5% by weight, preferably from about 2 to 3% by weight, based on the sum of all components then present in the precursor layer. The thickness of the depot layer is usually from half to 1/30 of the total thickness of the precursor layer and the depot layer taken together, for example 1/10 of the total thickness of the two layers. The concentration of the thermally decomposing polymerization initiators in the depot layer is thus from twice to thirty times the desired concentration of the polymerization initiators after they have diffused into the precursor layer, for example from 20 to 30% by weight, based on the sum of components (e) to (h), in the case of a depot layer thickness of 1/10 of the total layer thickness of the two layers.

The total thickness of relief-forming elastomeric layer D or precursor layer V and depot layer D is generally from 0.4 to 7 mm.

The depot layer may, if desired, comprise an absorber for laser light as component (g). Suitable absorbers are the absorbers mentioned above as component (c) in the amounts indicated there. The depot layer comprises an absorber if, in accordance with an embodiment of the process according to the invention, it remains on the printing side of the flexographic printing element during the laser engraving and is laser-engraved together with the relief-forming layer E.

The depot layer may optionally comprise further additives as component (h) for establishing the properties of the depot layer, such as plasticizers, fillers, dyes, compatibilizers or dispersion aids, in amounts of up to 20% by weight, preferably up to 10% by weight.

The two-layer composite consisting of depot layer D and precursor layer V can be produced in various ways. In general, the two-layer composite is not isolated, but instead is produced as part of a multilayer composite which comprises the two-layer composite and in addition further layers, support films or foils and/or protective foils which are usual in the case of laser-engravable flexographic printing elements or in general in flexographic printing elements. The multilayer composite is usually limited by a dimensionally stable support film or foil on one side and by a removable protective film on the other side or alternatively by two protective films. A conventional adhesive layer may be present between the depot layer D and a support film or foil coated therewith. The printing side of the elastomeric, laser-engravable, relief-forming layer or, where appropriate, also of a laser-engravable depot layer D on top of the former may have a top layer in order to improve the printing properties. A removable protective film may be coated with a relief layer. These multilayer composites are produced by processing correspondingly pre-coated films or foils by one of the calendering, lamination, casting or compression molding processes described below.

Suitable dimensionally stable supports S are plates, foils and films made from metals, such as steel, aluminum, copper or nickel, or plastics, such as polyethylene terephthalate (PET), polyethylene naphthylate(PEN), polybutylene terephthalate(PBT), polyamide, polycarbonate, if desired also woven and nonwoven fabrics, such as woven glass fiber fabrics and composite materials made from glass fibers and plastics. Particularly suitable dimensionally stable supports are dimensionally stable support films, for example polyester films, in particular PET or PEN films. The thickness of the support foil or film is generally from 75 to 225 μm. The support foil or film may be coated with an adhesive layer A.

The multilayer element may comprise a thin top layer T on the precursor layer V or the laser-engravable depot layer D. A top layer of this type enables the parameters which are important for the printing behavior and ink transfer, such as roughness, abrasiveness, surface tension, surface tack or solvent resistance, to be modified at the surface without affecting the relief-typical properties of the printing plate, for example hardness or elasticity. Surface properties and layer properties can thus be modified independently of one another in order to achieve an optimum print result. The composition of the top layer is only restricted inasmuch as the laser engraving of the underlying laser-engravable layer must not be impaired and the top layer must be removable together therewith. The top layer should be thin compared with the laser-engravable layer. Very generally, the thickness of the top layer does not exceed 100 μm, the thickness preferably being from 1 to 80 μm, particularly preferably from 3 to 10 μm. The top layer should preferably be readily laser-engravable itself.

If desired, the multilayer element may also comprise a non-laser-engravable underlayer U, which is located between the support and the laser-engravable layer. Underlayers of this type enable the mechanical properties of the relief printing plates to be modified without affecting the relief-typical properties of the printing plate. Furthermore, the multilayer element may optionally be protected against mechanical damage by a protective film P, for example consisting of PET, which is located on the uppermost layer in each case, and which must in each case be removed before the laser engraving. The thickness of the protective films is generally from 75 to 225 μm.

The protective film may be coated with a relief layer R.

The thickness of the entire multilayer element is generally from 0.7 to 7 mm.

The shaping of the precursor layer comprising a mixture of components (a) to (d) can be carried out before, during or after the precursor layer V or the mixture is brought into contact with the depot layer D.

In an embodiment of the process according to the invention, the two-layer composite comprising D and V can be produced by extrusion of a melt comprising components (a) to (d) and calendering this melt between a first foil or film and a second foil or film, where at least one foil or film is coated with the depot layer D. It is possible for only one or both foils or films to be coated with the depot layer D, it being possible for further layers to be present between the depot layer D and the foil or film. Preferably, only one foil or film is coated with a depot layer. The other foil or film may likewise be coated with further layers. It is also possible for a plurality of layers to be coextruded, for example the precursor layer V and an overlying top layer T.

The process according to the invention also enables production of the thermally crosslinkable flexographic printing elements by conventional twin-screw extrusion and calendering of the crosslinkable layer. This process offers the advantage that small thickness tolerances are observed, the components are mixed during the extrusion process, and layer thicknesses of >1 mm are obtainable.

In a further embodiment of the process according to the invention, the two-layer composite consisting of D and V is produced by lamination of a first foil or film coated with the depot layer D onto a second foil or film coated with the precursor layer V. Further layers may be present between the depot layer D and the first foil or film or between the precursor layer V and the second foil or film.

In a further embodiment of the process according to the invention, the two-layer composite consisting of D and V is produced by applying a shapeable mixture, solution or dispersion comprising components (a) to (d) onto a foil or film which is coated with the depot layer D, and, if necessary, subsequently drying the composite. The two-layer composite can be produced by application of a shapeable melt followed by pressing or by casting the solution or dispersion followed by drying. It is also possible to cast a plurality of layers one on top of the other, for example the precursor layer V and on top a top layer T.

In a second step (ii), the thermally decomposing polymerization initiators are allowed to diffuse out of the depot layer D into the precursor layer V, preferably until they are homogeneously distributed in the precursor layer V. The diffusion of the polymerization initiators can be effected by simple storage of the multilayer elements for a period of from 1 to 100 days, preferably for from 3 to 14 days. The diffusion can also take place at elevated temperature, for example from 30 to 80° C., which significantly shortens the requisite storage time. For example, the storage time shortens from 7 days to from 3 to 8 hours by increasing the temperature to 80° C.

If desired, the depot layer D is removed in a third step (iii). To this end, the depot layer D is removed, for example by delamination, after the diffusion from the precursor layer. For this purpose, the adhesion between the precursor layer V and the depot layer D should be less than 1 N/4 cm, preferably less than 0.5 N/4 cm.

This is followed by the fourth step (iv), the thermal crosslinking of the precursor layer V to give the elastomeric, laser-engravable, relief-forming layer E. The thermal crosslinking is carried out by warming the multilayer element to temperatures of in general from 80 to 220° C., preferably from 120 to 200° C., over a period of from 2 to 30 minutes.

The laser-engravable flexographic printing elements produced in accordance with the invention serve as starting material for the production of relief printing plates. The process comprises firstly peeling off any protective film present. In the subsequent process step (v), a printing relief is engraved into the recording material by means of a laser. It is advantageous to engrave pixels whose edges initially drop off vertically and only spread out in the lower region of the pixel. This results in a good shoulder shape of the image dots, but nevertheless low dot gain. However, it is also possible to engrave image dot edges of a different shape.

Particularly suitable for laser engraving are CO2 lasers having a wavelength of 10640 nm, but also Nd:YAG lasers (1064 nm) and IR diode lasers or solid-state lasers, which typically have wavelengths of from 700 to 900 nm and from 1200 to 1600 nm. However, it is also possible to employ lasers of shorter wavelength provided that the lasers have adequate intensity. For example, a frequency-doubled (532 nm) or frequency-tripled (355 nm) Nd:YAG laser or an excimer laser (for example 248 nm) can also be employed. The image information to be engraved is transferred directly from the layout computer system to the laser apparatus. The lasers can be operated either continuously or in pulsed mode.

The relief layer is removed very completely by the laser, and consequently intensive post-cleaning is generally unnecessary. If desired, however, the printing plate obtained can subsequently be cleaned. A cleaning step of this type removes layer constituents which have been detached, but have not yet been completely removed from the plate surface. In general, simple wetting with water is entirely sufficient.

In an embodiment of the process for the production of relief printing plates, the depot layer D is itself laser-engravable and is located on the printing side of the flexographic printing element, a relief being engraved into the depot layer D, which comprises a material which absorbs laser light, and into the underlying relief-forming elastomeric layer E.

The invention also relates to multilayer composites comprising the two-layer composite consisting of depot layer D and uncrosslinked precursor layer V.

In one embodiment, the multilayer element according to the invention comprises, in the sequence (I)–(VII), (I) a support foil or film S, (II) optionally an adhesive layer A, (III) an adhering depot layer D, (IV) a precursor layer V, (V) a top layer T, (VI) optionally a release layer R, and (VII) a removable protective film P.

In a further embodiment, the multilayer composite according to the invention comprises, in the sequence (I)–(V), (I) a support foil or film S, (II) an adhesive layer A, (III) a precursor layer V, (IV) a laser-engravable depot layer D, and (V) a removable protective film P.

In a further embodiment, the multilayer composite according to the invention comprises, in the sequence (I)–(V), (I) a support foil or film S, (II) an adhesive layer A, (III) a precursor layer V, (IV) a non-adherent, removable depot layer D, and (V) a protective film P which adheres well to D.

In a further embodiment, the multilayer composite according to the invention comprises, in the sequence (I)–(VI), (I) a removable protective film P, (II) optionally a release layer R, (III) a top layer T, (IV) a precursor layer V, (V) a non-adherent, removable depot layer D, and (VI) a removable protective film P.

The non-adherent, removable depot layer D may be removed before the thermal crosslinking without significantly affecting the surface quality. To this end, the binders in D are selected in such a way that the adhesion of D in the uncrosslinked state to V is less than 1 N/4 cm, preferably less than 0.4 N/4 cm.

The invention is explained in greater detail by the following examples.

EXAMPLES

General Experimental Method

After successive metering of binder and other constituents of a conventional flexographic printing plate denoted in more detail at a uniform rate into a twin-screw extruder (ZSK 53, Werner & Pfleiderer), the homogeneous melt or shapeable mixture was extruded through a flat-film die.

The supported peroxide depot layers D1 and D2 were attached to a dimensionally stable film in such a way that the applied peroxide depot layer was able to form a layer deposit during calendering with the elastomeric melt or with the shapeable elastomeric mixture.

After a defined waiting time for distribution of peroxide components by diffusion into the later printing element-forming layer V, the layer composite D1/V or the printing element-forming layer E separated from the peroxide depot layer was fully or partially crosslinked under the defined conditions to give layer E.

The term “layer composite” in this connection is taken to mean direct contact between the printing element-forming layer V and at least one peroxide depot layer D1 or D2, so long as this contact has existed at least for the duration of the combination process, but otherwise independently of a fixed time span of the contact after the combination process.

Measurements for Checking the Crosslinking Quality

In order to check the crosslinking quality of the two-layer composition as a function of the further treatment, swelling and extraction in toluene were determined. Furthermore, ultimate tensile stress and elongation at break were determined in a tensile measurement (Zwick universal tester).

The relative percentage increase in the measured values compared with an equivalent elastomeric single layer without bonding to a peroxide depot layer (“raw layer”) is regarded as a measure of the crosslinking quality.

Comparative Example A1

100 parts by weight of an unexposed nyloflex® FAH printing plate based on SIS block copolymers as binders (Kraton® D-1161NU from Shell), hexanediol diacrylate and dimethacrylate as monomers, oligobutadiene, PE wax and stabilizer were compounded in a Haake laboratory compounder for a period of 10 minutes at an initial temperature of 150° C. and a speed of 160 rpm. The material temperature remained constant at 166° C., and the torque reached a plateau at about 2 Nm. The toluene extract fraction of the compounded mixture is 100%.

Comparative Example A2

97 parts by weight of the unexposed nyloflex® FAH printing plate from Comparative Example A1 were compounded in a Haake compounder for a period of one minute at an initial temperature of 150° C. and a speed of 160 rpm. Without interrupting the compounding process, 3 parts by weight of dicumyl peroxide were subsequently added. Within less than one minute, the material temperature increased from 163° C. to 175° C. and the torque increased to about 12 Nm. If the compounding process is continued to a total duration of 10 minutes, the torque and temperature drop again, and the melt becomes granular and inhomogeneous. The toluene extract fraction of the compounded mixture is only 36%.

Comparative Example B1

The constituents of the printing plate recipe described in Example 1 of EP-A 0 326 977 were compounded in a Haake compounder for a period of 10 minutes at an initial temperature of 150° C. and a speed of 160 rpm. The material temperature was constant at 180° C., and the torque reached a plateau at about 7 Nm. The toluene extract fraction of the compounded mixture is 100%.

Comparative Example B2

97 parts by weight of the printing plate recipe described in Example 1 of EP-A 0 326 977 were compounded in a Haake compounder for a period of one minute at an initial temperature of 150° C. and a speed of 160 rpm. Without interrupting the compounding process, 3 parts by weight of dicumyl peroxide were subsequently added. Within less than one minute, the material temperature increased from 176° C. to 188° C. and the torque increased to about 20 Nm. If the compounding process is continued to a total duration of 10 minutes, the torque and temperature drop again, and the melt becomes granular and inhomogeneous. The toluene extract fraction of the compounded mixture is only 32%.

Example 1

A peroxide depot adhesion layer D1 was produced as follows: 80 g of a styrene-isoprene-styrene block copolymer (Kraton® D-1161NU from Shell) were dissolved in 185 ml of toluene at 110° C. After the solution had cooled to 60° C., 20 g of dicumyl peroxide were added, and the mixture was stirred further until the solution was clear and homogeneous (approximately 1 hour). The solution prepared in this way was applied to a PET protective film in various layer thicknesses by means of a laboratory knife coater. The layers obtained were subsequently dried for one day at room temperature and finally for 3 hours at 35° C.

A low-oxygen melt was prepared from the constituents of a nyloflex® FAH printing plate by the above-mentioned process.

The two-layer composite D1/V was then produced by calendering-in the depot layers described, where the second dimensionally stable support used was a commercially available PET film.

Example 1a

The resultant two-layer composite consisting of peroxide depot adhesion layer and elastomeric printing element-forming layer was stored at room temperature for one week.

Example 1b

After storage for 1 week, the two-layer composite D1/V from Example 1a was heated at 160° C. for a period of 20 minutes in a normal air atmosphere.

Example 1c

After storage for 1 week, the two-layer composite D1/V from Example 1a was firstly conditioned at 80° C. for 3 hours and subsequently heated at 160° C. for a period of 20 minutes in a normal air atmosphere.

Example 2

A further peroxide depot adhesion layer D1 was produced as follows: 80 g of a styrene-butadiene/styrene-styrene block copolymer (Styroflex® BX 6105, BASF) were dissolved in 150 ml of toluene at 110° C. After the solution had cooled to 60° C., 20 g of dicumyl peroxide were added, and the mixture was stirred further until the solution was clear and homogeneous (approximately 1 hour). The solution prepared in this way was applied to a PET protective film in various layer thicknesses by means of a laboratory knife coater. The layers obtained were subsequently dried for one day at room temperature and finally for 3 hours at 35° C.

A low-oxygen melt was prepared from the constituents of a nyloflex® FAH printing plate by the above-mentioned process.

The two-layer composite D1/V was then produced by calendering-in the depot layers described, where the second dimensionally stable support used was a commercially available PET film.

Example 2a

The resultant two-layer composite consisting of peroxide depot adhesion layer and elastomeric printing element-forming layer was stored at room temperature for one week.

Example 2b

After storage for 1 week, the two-layer composite D1/V from Example 2a was heated at 160° C. for a period of 20 minutes in a normal air atmosphere.

Example 2c

After storage for 1 week, the two-layer composite D1/V from Example 2a was firstly conditioned at 80° C. for 3 hours and subsequently heated at 160° C. for a period of 20 minutes in a normal air atmosphere.

Example 3

A peroxide depot release layer D2 was produced as follows: 80 g of a polyamide hot-melt adhesive (Macromelt® 6208, Henkel) were dissolved in a mixture of 90 ml of toluene and 90 ml of 1-propanol at 95° C. After the solution had cooled to 60° C., 20 g of dicumyl peroxide were added, and the mixture was stirred further until the solution was clear and homogeneous (approximately 1 hour). The solution prepared in this way was applied to a PET protective film in various layer thicknesses by means of a laboratory knife coater. The layers obtained were subsequently dried for one day at room temperature and finally for 3 hours at 35° C.

A low-oxygen melt was prepared from the constituents of a nyloflex® FAH printing plate by the above-mentioned process.

The two-layer composite D2/V was then produced by calendering-in the depot layer described, where the second dimensionally stable support used was a commercially available PET film.

Example 3a

The resultant two-layer composite consisting of peroxide depot release layer and elastomeric printing element-forming layer was stored at room temperature for one week.

Example 3b

After storage for 1 week, the two-layer composite D2/V from Example 3a was separated, i.e. the depot release layer D2 was removed from the precursor layer. The peroxide-containing precursor layer V was heated at 160° C. for a period of 20 minutes in a normal air atmosphere.

Example 3c

After storage for 1 week, the two-layer composite D2/V from Example 3a was separated, i.e. the depot release layer D2 was removed from the precursor layer. The peroxide-containing precursor layer V was firstly conditioned at 80° C. for 3 hours and subsequently heated at 160° C. for a period of 20 minutes in a normal air atmosphere.

Example 4

A further peroxide depot adhesion layer D1 was produced as follows: 64 g of an ethylene-propylene-diene terpolymer (Buna EP G-KA 8869, Bayer) and 6 g of an aliphatic ester plasticizer (Plastomoll® DNA, BASF) were dissolved in 260 ml of toluene at 110° C. After the solution had cooled to 60° C., 30 g of dicumyl peroxide were added, and the mixture was stirred further until the solution was clear and homogeneous (approximately 1 hour). The solution prepared in this way was applied to a PET protective film in various layer thicknesses by means of a laboratory knife coater. The layers obtained were subsequently dried for one day at room temperature and finally for 3 hours at 35° C.

A low-oxygen melt was prepared by the above-mentioned process from constituents, described in Patent No. EP 326977, of a printing plate layer based on EPDM (binder: Buna EP G-KA 8869, Bayer).

The two-layer composite D1/V was then produced by calendering-in the depot layers described, where the second dimensionally stable support used was a commercially available PET film.

Example 4a

The resultant two-layer composite consisting of peroxide depot adhesion layer and elastomeric printing element-forming layer was stored at room temperature for one week.

Example 4b

After storage for 1 week, the two-layer composite D1/V from Example 4a was heated at 160° C. for a period of 20 minutes in a normal air atmosphere.

Example 4c

After storage for 1 week, the two-layer composite D1/V from Example 4a was firstly conditioned at 80° C. for 3 hours and subsequently heated at 160° C. for a period of 20 minutes in a normal air atmosphere.

Example 5

A further peroxide depot adhesion layer D1 was produced as follows: 64 g of a cyclic rubber (Vestenamer® 6213, Creanova) and 6 g of an aliphatic ester plasticizer (Plastomoll® DNA, BASF) were dissolved in 150 ml of toluene at 110° C. After the solution had cooled to 60° C., 30 g of dicumyl peroxide were added, and the mixture was stirred further until the solution was clear and homogeneous (approximately 1 hour). The solution prepared in this way was applied to a PET protective film in various layer thicknesses by means of a laboratory knife coater. The layers obtained were subsequently dried for one day at room temperature and finally for 3 hours at 35° C.

A low-oxygen melt was prepared by the above-mentioned process from constituents of a printing plate layer, described in Patent No. EP 326977, based on EPDM (binder: Buna EP G-KA 8869, Bayer).

The two-layer composite D1/V was then produced by calendering-in the depot layers described, where the second dimensionally stable support used was a commercially available PET film.

Example 5a

The resultant two-layer composite consisting of peroxide depot adhesion layer and elastomeric printing element-forming layer was stored at room temperature for one week.

Example 5b

After storage for 1 week, the two-layer composite D1/V from Example 5a was heated at 160° C. for a period of 20 minutes in a normal air atmosphere.

Example 5c

After storage for 1 week, the two-layer composite D1/V from Example 5a was firstly conditioned at 80° C. for 3 hours and subsequently heated at 160° C. for a period of 20 minutes in a normal air atmosphere.

Example 6

This example illustrates the applicability of the principle to pigmented systems, which, owing to the strong absorption of the pigment in the UV region, cannot be photochemically crosslinked throughout:

A further peroxide depot adhesion layer D1 was produced as follows: 80 g of an ethylene-propylene-diene terpolymer (Buna EP G-KA 8869, Bayer AG) were dissolved in 260 ml of toluene at 110° C. After the solution had cooled to 60° C., 20 g of dicumyl peroxide were added, and the mixture was stirred further until the solution was clear and homogeneous (approximately 1 hour). The solution prepared in this way was applied to a PET protective film in various layer thicknesses by means of a laboratory knife coater. The layers obtained were subsequently dried for one day at room temperature and finally for 3 hours at 35° C.

A pigmented elastomeric printing element-forming layer V was produced as follows: 87% by weight of an ethylene-propylene-diene terpolymer (Buna EP G-KA 8869, Bayer AG) and 13% by weight of a basic carbon black (Printex® A, Degussa-Huels) were pre-compounded in a Haake laboratory compounder. The precompound was subsequently dissolved in sufficient toluene to form a 25 percent by weight solution in toluene. The solution prepared in this way was applied by means of a laboratory knife coater to a PET protective film in such a way that, after evaporation of the solvent, a dry layer thickness of about 800 $\mu$m was obtained.

The two-layer composite D1/V was then produced by laminating-on the depot layer described.

Example 6a

The resultant two-layer composite consisting of peroxide depot adhesion layer and pigmented elastomeric printing element-forming layer was stored at room temperature for one week.

Example 6b

After storage for 1 week, the two-layer composite D1/V from Example 6a was heated at 160° C. for a period of 20 minutes in a normal air atmosphere.

Example 6c

After storage for 1 week, the two-layer composite D1/V from Example 6a was firstly conditioned at 80° C. for 3 hours and subsequently heated at 160° C. for a period of 20 minutes in a normal air atmosphere.

Example 7

This example likewise illustrates the applicability of the principle to pigmented systems, which, owing to the strong absorption of the pigment in the UV region, cannot be photochemically crosslinked throughout:

A further peroxide depot adhesion layer D1 was produced as follows: 80 g of Kraton® D-1161 NU were dissolved in 190 ml of toluene at 110° C. After the solution had cooled to 60° C., 20 g of dicumyl peroxide were added, and the mixture was stirred further until the solution was clear and homogeneous (approximately 1 hour). The solution prepared in this way was applied to a PET protective film in various layer thicknesses by means of a laboratory knife coater. The layers obtained were subsequently dried for one day at room temperature and finally for 3 hours at 35° C.

A pigmented elastomeric printing element-forming layer V was produced as follows: 88.6% by weight of constituents of a nyloflex® FAH printing plate and 11.4% by weight of a basic carbon black (Printex® A, Degussa-Huels) were pre-compounded in a Haake laboratory compounder. The precompound was subsequently dissolved in sufficient toluene to form a 40 percent by weight solution in toluene. The solution prepared in this way was applied by means of a laboratory knife coater to a PET protective film in such a way that, after evaporation of the solvent, a dry layer thickness of about 800 $\mu$m was obtained.

The two-layer composite D1/V was then produced by laminating-on the depot layer described.

Example 7a

The resultant two-layer composite consisting of peroxide depot adhesion layer and pigmented elastomeric printing element-forming layer was stored at room temperature for one week.

Example 7b

After storage for 1 week, the two-layer composite D1/V from Example 7a was heated at 160° C. for a period of 20 minutes in a normal air atmosphere.

Example 7c

After storage for 1 week, the two-layer composite D1/V from Example 7a was firstly conditioned at 80° C. for 3 hours and subsequently heated at 160° C. for a period of 20 minutes in a normal air atmosphere.

Table 1 below shows the results of Comparative Examples A1 and A2 and Examples 1, 2, 3 and 6.

TABLE 1

| Example No. | Base layer thickness [μm] | Depot layer thickness [μm] | Toluene extract fraction [%] | Ultimate tensile stress [MPa] | Elongation at break [%] | Assessment |
|---|---|---|---|---|---|---|
| A1 | / | / | 100 | 0.1 | 105 | uncrosslinked |
| A2 | / | / | 36 | n.m. | n.m. | crosslinked, degradation |
| 1a | 800 | 100 | 100 | 0.2 | 125 | uncrosslinked |
| 2a | 780 | 120 | 100 | 0.2 | 125 | uncrosslinked |
| 3a | 805 | 95 | 100 | 0.2 | 130 | uncrosslinked |
| 6a | 800 | 120 | | 0.2 | 378 | uncrosslinked |
| 1b | 800 | 100 | 8 | 2.0 | 100 | crosslinked |
| 2b | 780 | 120 | 8 | 1.5 | 60 | crosslinked |
| 3b | 805 | 95 | 9 | 2.4 | 110 | crosslinked |
| 6b | 800 | 120 | 18 | 0.8 | 125 | crosslinked |
| 1c | 800 | 100 | 8 | 2.2 | 110 | crosslinked |
| 2c | 780 | 120 | 8 | 1.7 | 80 | crosslinked |
| 3c | 805 | 95 | 8 | 4.3 | 170 | crosslinked |
| 6c | 800 | 120 | 6 | 2.4 | 310 | crosslinked |

It can clearly be seen that samples b) and c) were crosslinked by the thermal treatment, which is evidenced by the low values for the toluene extract fraction and the greatly increased ultimate tensile stress. By contrast, the samples only stored remained uncrosslinked. A reference sample (Comparative Example A1) which was compounded without initiator likewise remained uncrosslinked. An identical sample (Comparative Example A2) to which, by contrast, the initiator was added during the compounding process crosslinked immediately within less than 1 minute. The crosslinked polymer was destroyed in the compounder by degradation and became inhomogeneous.

Table 2 below shows the results of Comparative Examples B1 and B2 and Examples 4, 5 and 7.

TABLE 2

| Example No. | Base layer thickness [μm] | Depot layer thickness [μm] | Toluene extract fraction [%] | Ultimate tensile stress [Mpa] | Elongation at break [%] | Assessment |
|---|---|---|---|---|---|---|
| B1 | / | / | 100 | 0.1 | 140 | uncrosslinked |
| B2 | / | / | 32 | n.m. | n.m. | crosslinked, degradation |
| 4a | 820 | 80 | 100 | <0.1 | 75 | uncrosslinked |
| 4a | 770 | 130 | 100 | <0.1 | 70 | uncrosslinked |
| 5a | 790 | 110 | 100 | 0.1 | 330 | uncrosslinked |
| 7a | 800 | 70 | 100 | 0.1 | 150 | uncrosslinked |
| 4b | 820 | 80 | 20 | 1.7 | 630 | crosslinked |
| 4b | 770 | 130 | 20 | 1.7 | 735 | crosslinked |
| 5b | 790 | 110 | 20 | 0.7 | 250 | crosslinked |
| 7b | 800 | 70 | 13 | 2.1 | 90 | crosslinked |
| 4c | 820 | 80 | 28 | 1.5 | 685 | crosslinked |
| 4c | 770 | 130 | 13 | 1.7 | 900 | crosslinked |
| 5c | 790 | 110 | 18 | 0.7 | 145 | crosslinked |
| 7c | 800 | 70 | 3 | 4.3 | 130 | crosslinked |

It can clearly be seen that samples b) and c) were crosslinked by the thermal treatment, which is evidenced by the low values for the toluene extract fraction and the greatly increased ultimate tensile stress. By contrast, the samples only stored remained uncrosslinked. A reference sample (Comparative Example B1) which was compounded without initiator likewise remained uncrosslinked. An identical sample (Comparative Example B2) to which, by contrast, the initiator was added during the compounding process crosslinked immediately within less than 1 minute. The crosslinked polymer was destroyed in the compounder by degradation and became inhomogeneous.

We claim:

1. A process for the production of a laser-engravable flexographic printing element comprising a thermally crosslinked, elastomeric, laser-engravable, relief-forming layer E, having the following steps:

(i) production of a multilayer composite at least comprising a two-layer composite consisting of a depot layer D and an uncrosslinked precursor layer V for the relief-forming layer E which is directly adjacent to the depot layer D, and optionally further layers, support foils or films and/or protective films, where the precursor layer V comprises (a) at least one elastomeric binder, (b) at least one ethylenically unsaturated monomer, (c) optionally an absorber for laser radiation, and (d) optionally further additives, where the depot layer D comprises (e) at least one elastomeric binder, (f) at least one thermally decomposing polymerization initiator, (g) optionally an absorber for laser radiation, and (h) optionally further additives, (ii) allowing the thermally decomposing polymerization initiators to diffuse out of the depot layer D into the precursor layer V, (iii) optionally removal of the depot layer D, and (iv) thermal crosslinking of the precursor layer V to give the crosslinked, elastomeric, laser-engravable, relief-forming layer E.

2. A process as claimed in claim 1, wherein the two-layer composite consisting of D and V is produced by extruding a melt comprising components (a) to (d), and calendering this melt between a first film or foil and a second film or foil, where at least one film or foil is coated with the depot layer D.

3. A process as claimed in claim 1, wherein the two-layer composite consisting of D and V is produced by laminating a first film or foil coated with the depot layer D onto a second film or foil coated with the precursor layer V.

4. A process as claimed in claim 1, wherein the two-layer composite consisting of D and V is produced by applying a moldable mixture, solution or dispersion comprising components (a) to (d) onto a film or foil coated with the depot layer D, and if necessary subsequently drying the composite.

5. A process for the production of a relief printing plate comprising steps (i) to (iv), as defined in claim 1, and the additional step (v) engraving of a printing relief into the thermally crosslinked, elastomeric, relief-forming layer E by means of a laser.

6. A process as claimed in claim 5, wherein the depot layer D is located on the printing side of the flexographic printing element, and the relief is engraved into the depot layer D, which comprises a material which absorbs laser light, and the underlying elastomeric, relief-forming layer E.

7. A multilayer composite comprising, in the sequence (I)-(VII), (I) a support foil or film S, (II) optionally an adhesive layer A, (III) an adherent depot layer D comprised of at least one elastomeric binder, and at least one thermally decomposing polymerization initiator, and optionally an absorber for laser radiation and/or further additives, (IV) a precursor layer V comprised of at least one elastomeric binder and at least one ethylenically unsaturated monomer, and optionally an absorber for laser radiation and/or further additives, (V) a top layer T, (VI) optionally a release layer R, (VII) a removable protective film P.

8. A multilayer composite comprising, in the sequence (I)-(V), (I) a support foil or film S, (II) an adhesive layer A, (III) a precursor layer V comprised of at least one elastomeric binder and at least one ethylenically unsaturated monomer, and optionally an absorber for laser radiation and/or further additives, (IV) a laser-engravable depot layer D comprised of at least one elastomeric binder, and at least one thermally decomposing polymerization initiator, and optionally an absorber for laser radiation and/or further additives, V) a removable protective film P.

9. A multilayer composite comprising, in the sequence (I)-(V)

(I) a support foil or film S, (II) an adhesive layer A, (III) a precursor layer V comprised of at least one elastomeric binder and at least one ethylenically unsaturated monomer, and optionally an absorber for laser radiation and/or further additives, (IV) a non-adherent, removable depot layer D comprised of at least one elastomeric binder, and at least one thermally decomposing polymerization initiator, and optionally an absorber for laser radiation and/or further additives, (V) a removable protective film P.

10. A multilayer composite comprising, in the sequence (I)-(VI), (I) a removable protective film P, (II) optionally a release layer R, (III) a top layer T, (IV) a precursor layer V comprised of at least one elastomeric binder and at least one ethylenically unsaturated monomer, and optionally an absorber for laser radiation and/or further additives, (V) a non-adherent, removable depot layer D comprised of at least one elastomeric binder, and at least one thermally decomposing polymerization initiator, and optionally an absorber for laser radiation and/or further additives, (VI) a removable protective film P.

* * * * *